United States Patent
Ho et al.

(10) Patent No.: US 10,530,496 B2
(45) Date of Patent: Jan. 7, 2020

(54) GALVANICALLY ISOLATED AUXILIARY LED FOR PERFORMING INPUT OPERATIONS

(71) Applicant: Avago Technologies International Sales Pte. Limited, Singapore (SG)

(72) Inventors: Choon Ngiap Ho, Singapore (SG); Roy Tan, Singapore (SG); Yuen Yin Chan, Singapore (SG)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/715,429

(22) Filed: Sep. 26, 2017

(65) Prior Publication Data

US 2019/0097736 A1    Mar. 28, 2019

(51) Int. Cl.
*H04B 10/80* (2013.01)
*H01L 25/16* (2006.01)
*H02H 7/08* (2006.01)

(52) U.S. Cl.
CPC .......... *H04B 10/80* (2013.01); *H01L 25/16* (2013.01); *H02H 7/08* (2013.01)

(58) Field of Classification Search
CPC .................................................. H04B 10/802
See application file for complete search history.

(56) References Cited

U.S. PATENT DOCUMENTS

| | | | | |
|---|---|---|---|---|
| 4,100,423 A | * | 7/1978 | Krause | H04B 10/802 250/214 A |
| 4,420,841 A | * | 12/1983 | Dudash | H04B 10/802 250/551 |
| 5,753,929 A | * | 5/1998 | Bliss | G02B 6/4295 250/551 |
| 2008/0317476 A1 | * | 12/2008 | Tsuji | B82Y 20/00 398/140 |
| 2010/0109545 A1 | | 5/2010 | Eiring et al. | |
| 2013/0168531 A1 | * | 7/2013 | Wong | G01J 1/4257 250/201.1 |
| 2013/0181232 A1 | * | 7/2013 | Jeromerajan | H01L 31/0203 257/81 |
| 2014/0119739 A1 | * | 5/2014 | Maasi | H04B 1/587 398/158 |
| 2017/0098635 A1 | | 4/2017 | Chen | |

* cited by examiner

*Primary Examiner* — Nathan M Cors
(74) *Attorney, Agent, or Firm* — Sheridan Ross P.C.

(57) ABSTRACT

An isolation device, a control system, and a method are disclosed. An illustrative system is disclosed to include a first power domain in which a first emitter is disposed. The system further includes a third power domain in which a second emitter is disposed. The system also includes a second power domain in which a detector is disposed, where the second power domain is electrically isolated from both the first power domain and the third power domain, where the detector is configured to receive a first control signal from the first emitter as well as a second control signal from the second emitter and produce an output in response thereto that represents a combination of the first control signal and the second control signal.

20 Claims, 13 Drawing Sheets

GALVANICALLY ISOLATED AUXILIARY LED FOR PERFORMING INPUT OPERATIONS

FIELD OF THE DISCLOSURE

The present disclosure is generally directed toward motor control systems, electronic isolation, and devices for accommodating the same.

BACKGROUND

Load controllers are often used to control electrical current provided to large electrical or electromechanical loads. An example of such a load is a 3-phase motor, which may be controlled by one or more load controllers. Often times, the load controllers are implemented as high-voltage devices that receive their control signals from a microcontroller, which is operating in a lower voltage environment and is separated from the load controllers by an electrical isolation barrier. Thus, a microcontroller is capable of controlling a large electrical or electromechanical load, such as a 3-phase motor, even though the microcontroller operates in a much different voltage environment. In many instances, the microcontroller is able to control the 3-phase motor via a switching pattern applied by the load controllers in the high-voltage environment.

In the event of a fault where the primary power domain (e.g., the domain in which the microcontroller is situated) is lost, it is desirable to maintain control over the switching functions of the load controllers so that the motor can be shut down safely. Otherwise, the residue current in the motor windings could damage other electronic devices or present a hazard to persons around the motor.

There are many other types of electrical systems that benefit from electrical isolation. Galvanic isolation is a principle of isolating functional sections of electrical systems to prevent current flow, meaning that no direct electrical conduction path is permitted between different functional sections (e.g., distinct power domains are maintained while allowing control signals to pass between the power domains). As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, opto-couplers, inductive, and capacitive isolators.

BRIEF DESCRIPTION OF THE DRAWINGS

The present disclosure is described in conjunction with the appended figures, which are not necessarily drawn to scale.

DETAILED DESCRIPTION

Figure 1:
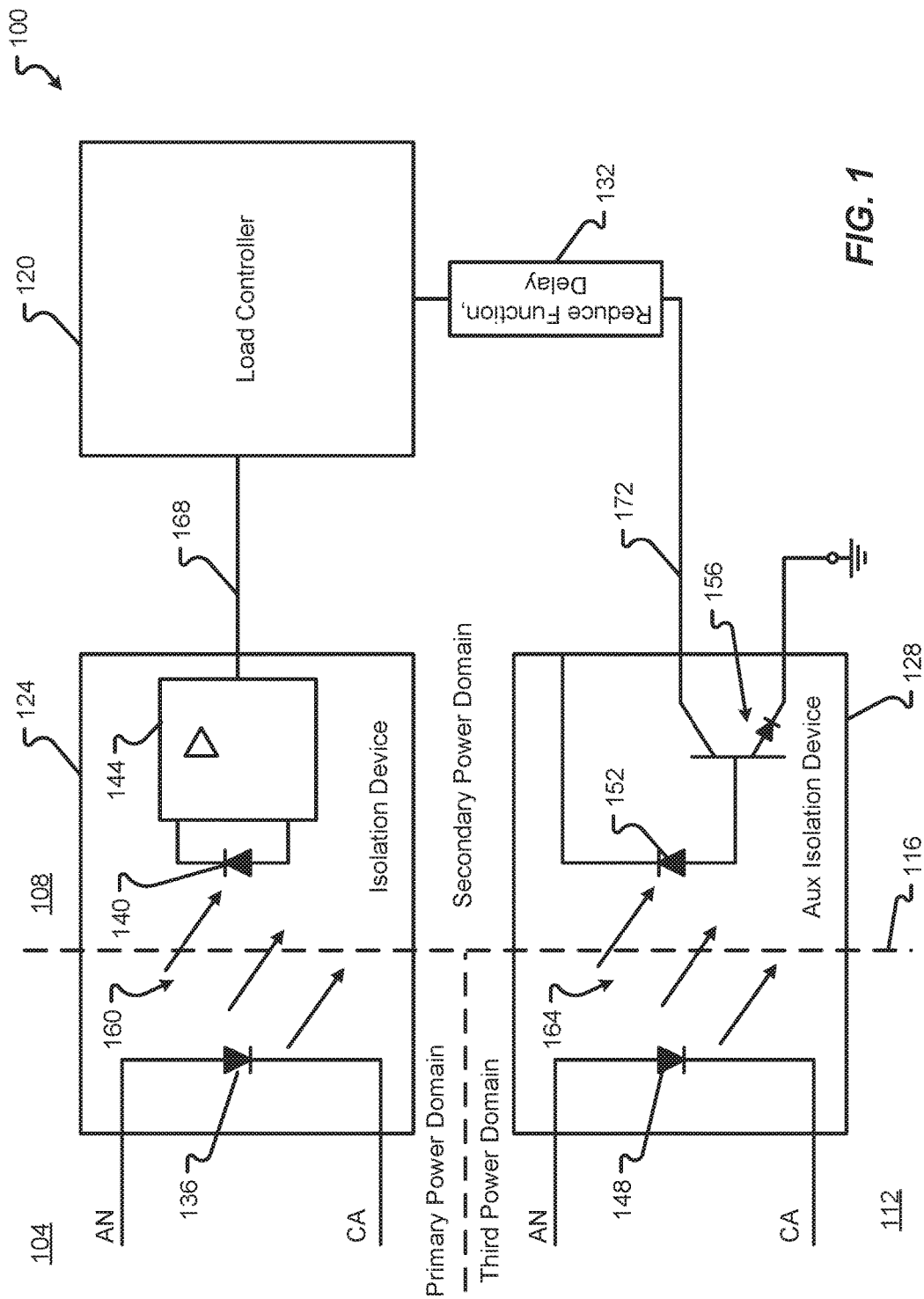
FIG. 1 is a schematic block diagram depicting a control system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-12, various configurations of control systems, isolation devices useable in control systems, and methods of operating control systems are depicted and described. In some embodiments, the isolation devices described herein may be incorporated into any system which requires current and/or voltage monitoring, but is susceptible to transients. A control system, such as a motor control system, is an example of such an environment that can benefit from the use of isolation devices. In some embodiments, the control systems in which an isolation device described herein is rated to operate at about 5 kV, 10 kV, or more. Stated another way, the output side (e.g., a high-voltage side) of the isolation device may be directly connected to a 5 kV, 10 kV, 15 kV or greater source without damaging the isolation device or any electronic devices attached to the input side (e.g., a low-voltage side) of the isolation device.

It should be appreciated that the disclosed components and concepts may be utilized in any type of isolation device, isolator, or isolation system. For instance, the concepts disclosed herein can be employed by optical isolators (e.g., where optical signals are used to communicate across an isolation material), capacitive isolators (e.g., where capacitive signals are used to communicate across an isolation material), inductive isolators (e.g., where RF or inductive signals are used to communicate across an isolation material), magnetic isolators (e.g., where magnetic signals are used to communicate across an isolation material), etc.

In some embodiments, an isolation device is provided that comprises:

a first emitter configured to produce a first signal;

a second emitter configured to produce a second signal;

a detector configured to receive the first signal and the second signal, when produced by the first emitter or second emitter, respectively, wherein the detector is configured to generate an output representing a combination of the first signal and the second signal, wherein the detector is electrically isolated from the first emitter and second emitter such that electrical current flowing through the first emitter or second emitter is substantially prevented from passing to the detector; and an encapsulant that encapsulates at least two of the first emitter, the second emitter, and the detector, wherein the first signal and the second signal are both capable of passing through the encapsulant.

In some embodiments, the first emitter and the second emitter are both encapsulated by the encapsulant and the encapsulant electrically isolates the first emitter from the second emitter.

In some embodiments, the isolation barrier also assists with the electrical isolation and has a greater isolation property than the encapsulant.

In some embodiments, the encapsulant includes a first material configured to electrically isolate the detector from the first emitter and a second material configured to electrically isolate the detector from the second emitter.

In some embodiments, the first emitter is substantially closer to the detector than the second emitter.

In some embodiments, the first emitter is substantially aligned with a face of the detector whereas the second emitter is diagonally-oriented with respect to the face of the detector.

In some embodiments, a vertical axis extends substantially orthogonally with respect to the face of the detector and wherein the vertical axis substantially intersects the first emitter but not the second emitter.

In some embodiments, the second emitter is at least twice as far away from the detector as compared to the first emitter.

In some embodiments, the output of the detector corresponds to a combination of the first control signal and the second control signal.

In some embodiments, the first emitter is coupled to a first supply voltage and a first ground, the second emitter is coupled to a second supply voltage and a second ground, the detector is coupled to a third supply voltage and a third ground, and the first supply voltage, the second supply voltage, and the third supply voltage are electrically isolated from one another.

In some embodiments, the first ground and the second ground are a common ground.

In some embodiments, the first ground, the second ground, and the third ground are each electrically isolated from one another.

In some embodiments, the output of the detector substantially represents the first control signal when the second control signal is not being transmitted and wherein the output of the detector substantially represents the second control signal when the first control signal is not being transmitted.

In some embodiments, the detector is configured to apply a first threshold level and a second threshold level in connection with producing the output, the first threshold level is configured to be compared to a first received signal correlated with the first control signal, and the second threshold level is configured to be compared to a second received signal correlated with the second control signal.

In some embodiments, the second threshold level is larger than the first threshold level such that the second received signal overrides the first received signal.

In some embodiments, the second threshold level is larger than the first threshold level such that a logic function OR is performed with the first received signal and the second received signal.

In some embodiments, the second threshold level is larger than the first threshold level such that a logic function AND is performed with the first received signal and the second received signal.

Referring now to FIG. 1, a first control system 100 will be described in accordance with at least some embodiments of the present disclosure. The control system 100 is shown to include a primary power domain 104, a secondary power domain 108, and at least a third power domain 112. It should be appreciated that at least the secondary power domain 108 is electrically isolated from the primary power domain 104 and third power domain 112 via an isolation boundary 116. In the embodiment shown in FIG. 1, the isolation boundary 116 may be established through an encapsulant material that is made from electrically isolation. As will be discussed in further detail herein, the isolation boundary 116 may sufficiently prohibit electrical current from flowing between the primary power domain 104 and secondary power domain 108. Likewise, the isolation boundary 116 may sufficiently prohibit electrical current from flowing between the third power domain 112 and the secondary power domain 112. Additionally, in some embodiments, the isolation boundary 116 may also reside between the primary power domain 104 and the third power domain 112, although such a configuration is not required. For instance, in some embodiments, the primary power domain 104 and third power domain 112 may share a common ground whereas in other embodiments the primary power domain 104 and third power domain 112 may have different ground potentials.

In some embodiments, the secondary power domain 108 corresponds to a high-voltage power domain whereas the primary power domain 104 and/or third power domain 112 correspond to low-power domains. As an example, the secondary power domain 108 may have voltages in the range of 1 kV-10 kV whereas the primary power domain 104 and/or third power domain 112 may have voltages in range of millivolts or only a couple of volts.

Even though the secondary power domain 108 is operating at a significantly different voltage range than the primary power domain 104 or third power domain 112, embodiments of the present disclosure still enable a load controller 120 in the secondary power domain 108 to receive control signals from the primary power domain 104 and/or third power domain 112. As a non-limiting example, a first isolation device 124 and auxiliary isolation device 128 are provided to enable control signals to pass across the isolation boundary 116 without allowing current or transients to pass across the isolation boundary 116. In the depicted embodiment, the first isolation device 124 and auxiliary isolation device 128 provide similar functionality for the system 100 in that both isolation devices 124, 128 create and maintain the isolation boundary 116. Although the isolation boundary 116 is depicted as a single isolation boundary, it may be appreciated that the isolation boundary 116 may actually be a collection of multiple isolation boundaries separately established by the isolation device 124 and auxiliary isolation device 128. In some embodiments, the isolation boundary 116 may be established with the use of an isolation barrier (e.g., Kapton® tape or some other insulative film/material) positioned between components in different power domains. Alternatively, the isolation boundary 116 may be established with encapsulants. Alternatively, the isolation boundary 116 may be established by having voids of material (e.g., spaces filled with air or some other inert gas). Alternatively, the isolation boundary 116 may be established with a combination of these components (e.g., isolation barrier, encapsulant, and/or material gaps).

The first isolation device 124 is shown to connect with the load controller 120 directly through a first control line 168 whereas the auxiliary isolation device 128 is connected to the load controller 120 via an auxiliary control line 172. The auxiliary control line 172 is shown to have a reduce function and/or delay circuit component 132 positioned between the load controller 120 and auxiliary isolation device 128. This reduce function and/or delay circuit component 132 may be used to help ensure that control signals transmitted over the auxiliary control line 172 do not supersede or override control signals transmitted over the first control line 168. Accordingly, the first isolation device 124 may be considered the primary control device that carries the control signal intended to primarily control the load controller 120. The auxiliary isolation device 128, on the other hand, may generate an auxiliary control signal that is only used when the primary control signal transmitted over the first control line 168 is unavailable or undiscernible due to the primary power domain 104 failing. The reduce function and/or delay circuit component 132 may correspond to analog and/or digital circuitry used to reduce an amplitude of the control signal carried by the auxiliary control line 172 and/or delay delivery of the control signal carried by the auxiliary control line 172 to the load controller 120. The reduce function and/or delay circuit component 132 may include one or more digital signal buffers as well as one or more operational amplifiers.

The first isolation device 124 is shown to include a first emitter 136, a first detector 140, and a detector chip 144. The detector 140 and detector chip 144 are shown to reside in the secondary power domain 108 whereas the first emitter 136 is shown to reside in the primary power domain 104. In some embodiments, the first emitter 136 may receive an electrical control signal from a control signal source and, in response thereto, produce a first optical control signal 160 that is transmitted across the isolation boundary 116. As explained in earlier paragraph, the detector chip 144 is electrically isolated from the first emitter 136 such that electrical current flowing through the first emitter is substantially prevented from passing to the detector chip 144 by the isolation boundary 116. As can be appreciated, the nature of the first control signal 160 will depend upon the type of isolation device used. For instance, if the isolation device 124 corresponds to an inductive isolation device, then the first control signal 160 may be transmitted as an induced RF field. Alternatively or additionally, if the isolation device 124 corresponds to a capacitive isolation device, then the first control signal 160 may be transmitted as a capacitive inductance between two plates that are capacitively coupled to one another.

In the example of a first optical control signal 160, the first emitter 136 produces an optical signal that substantially represents electrical current received at the first emitter 136. In such an embodiment, the first emitter 136 may correspond to a Light Emitting Diode (LED), a collection of LEDs, a Vertical Cavity Surface Emitting Laser (VCSEL), or any other type of device configured to convert electrical energy into optical energy. The first optical control signal 160 travels across the isolation boundary 116 without requiring electrical energy to also pass across the isolation boundary 116. Accordingly, information and control signals can be communicated to the secondary power domain 108 while maintaining an electrical isolation between the secondary power domain 108 and primary power domain 104.

The first optical control signal 160 is received at the first detector 140, which converts the optical energy back into an electrical signal. In some embodiments, the first detector 140 may correspond to a photodetector, photodiode, or a photo-sensitive area of a detector chip 144. The detector chip 144 may include one or more amplification components that amplify the electrical signal produced by the first detector 140 prior to placing the output of the first detector 140 onto the first control line 168. The electrical signal produced by the first detector 140 may substantially represent the electrical signal provided to the first emitter 136. The electrical signal produced by the first detector 140, however, may be smaller in amplitude than the electrical signal initial provided to the first emitter 136 due to optical losses and/or inefficiencies of the first emitter 136 and/or first detector 140. As mentioned above, the control signal eventually transmitted by the first isolation device 124 to the load controller 120 may be transmitted by the first control line 168. This control signal may be a digital signal or an analog signal. Moreover, the control signal may correspond to the primary control signal provided to the load controller 120 as long as the primary power domain 104 is operational and the first isolation device 124 is capable of carrying the control signal across the isolation boundary 116.

The auxiliary isolation device 128 is shown to include components similar to the first isolation device 124. In particular, the auxiliary isolation device 128 is shown to include a second emitter 148, a second detector 152, and an amplifier/switch 156. The output of the amplifier/switch 156 may be provided to the load controller 120 via the auxiliary control line 172. Although the auxiliary isolation device 128 is shown as an optical isolation device, it should be appreciated that the auxiliary isolation device 128 does not need to utilize similar isolation components as the first isolation device 124. For instance, the auxiliary isolation device 128 may utilize other types of galvanic isolation components (e.g., capacitive, inductive, optical, etc.) as compared to the first isolation device 124. In the depicted embodiment, the second emitter 148 is shown to be an optical emitter, which may have similar properties to the first emitter 136. Likewise, the second detector 152 is shown to be an optical detector, which may have similar properties to the first detector 140. It should be appreciated, however, that the second emitter 148 may be different from the first emitter 136 and the second detector 152 may be different from the first detector 140 without departing from the scope of the present disclosure.

The second isolation device 128 may produce an auxiliary control signal for the load controller 120. In some embodiments, the auxiliary control signal may be used in combination with the primary control signal produced by the first isolation device 124 or the auxiliary control signal may only be used when the primary control signal is not present on the first control line 168. In some embodiments, the second emitter 148 is provided in a different power domain than the first emitter 136. This effectively means that if there is some failure in the primary power domain 104, the third power domain 112 may continue to operate and the second emitter 148 may continue to convert an electrical signal received thereby into a second optical signal 164 that is transmitted across the isolation boundary 116. The second control signal 164 may be received at the second detector 152 and converted into an auxiliary control signal that is provided to the amplifier/switch 156. The amplifier/switch 156 may simply amplify the electrical signal received from the second detector 152 or it may also selectively provide (or not provide) the signal onto the auxiliary control line 172. As can be appreciated, if the primary power domain 104 becomes inoperative or fails such that a primary control signal cannot be provided on the first control line 168, the auxiliary isolation device 128 may provide an auxiliary control signal on the auxiliary control line 172, thereby ensuring that the load controller 120 continues to receive some sort of control signal, which may help to safely turn off or otherwise control a load, such as a motor, that is being driven by the load controller 120.

As shown in FIG. 1, the auxiliary isolation device 128 is shown as being connected to a separate ground from the first isolation device 124. Moreover, the electrical signal provided to the first emitter 136 is shown as being a separate electrical signal from the electrical signal provided to the second emitter 148. In some embodiments, however, the first emitter 136 and second emitter 148 may receive copies of the same control input electrical signal, even though the first emitter 136 is provided in the primary power domain 104 and the second emitter 148 is provided in the third power domain 112.

Figure 2:
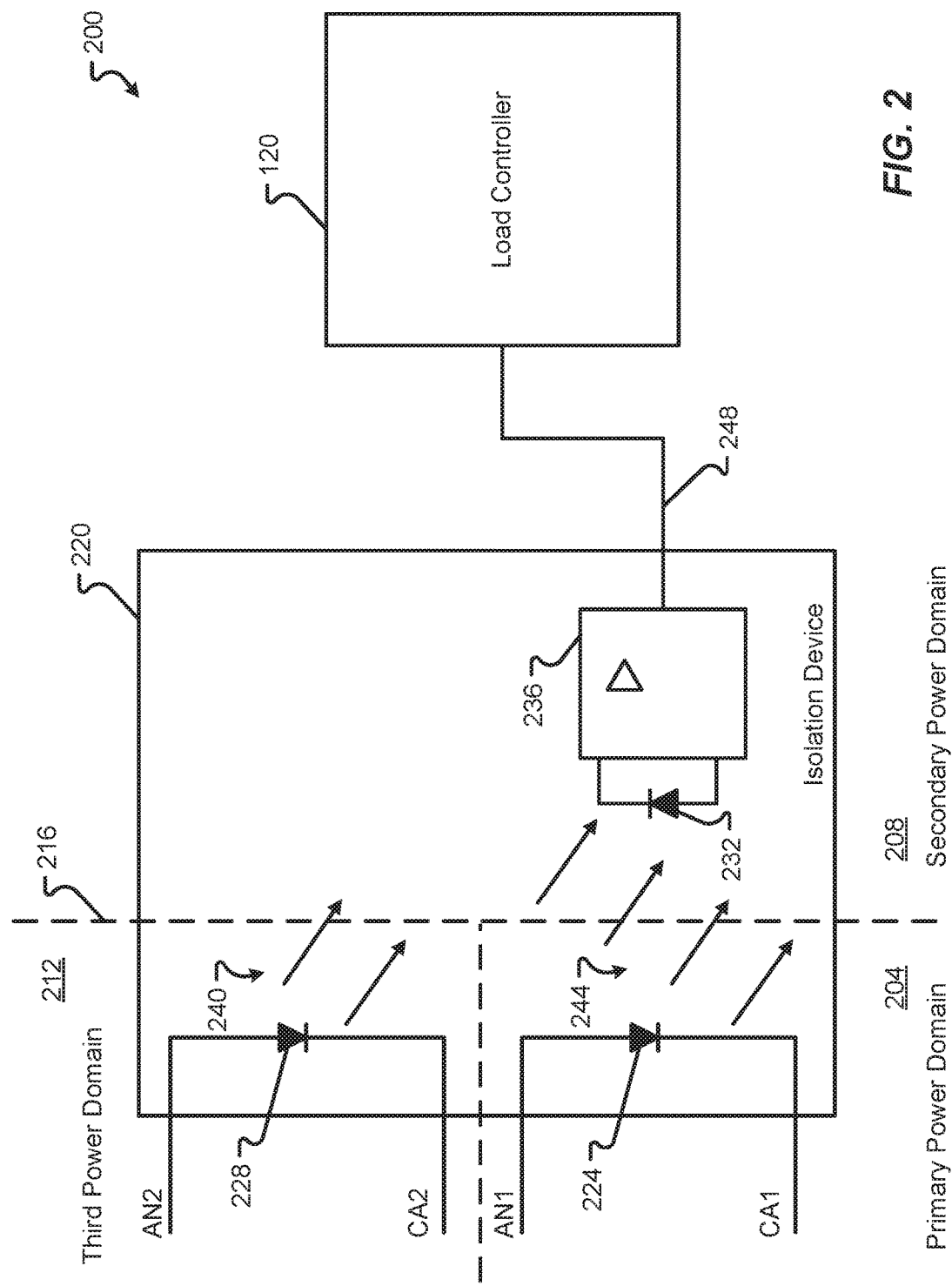
FIG. 2 is a schematic block diagram depicting another control system in accordance with embodiments of the present disclosure.

With reference now to FIG. 2, an alternative configuration of a control system 200 will be described in accordance with at least some embodiments of the present disclosure. The second control system 200 is shown to have several similar components to the first control system 100, except that the second control system 200 is shown to utilize a single isolation device 220 as opposed to separate isolation devices (e.g., the first isolation device 124 and auxiliary isolation device 128). Much like the first system 100, the second control system 200 is used to provide a load controller 120 operating in a secondary power domain 208 with control signals from a primary power domain 204 as well as a third power domain 212. The control system 200 also ensures that control circuitry located in the primary power domain 204 and/or third power domain 212 is electrically isolated from circuitry in the secondary power domain 208 since the secondary power domain 208 may be operating at a substantially higher nominal operating voltage than the power domains 204, 212.

The isolation device 220 helps create an isolation boundary 216 between the secondary power domain 208 and the other power domains 204, 212. In some embodiments, the isolation device 220 employs the use of optoelectronic components to carry control signals across the isolation boundary 216. In other embodiments, the isolation device 220 may utilize other types of galvanic isolation components (e.g., capacitive components, inductive components, etc.).

Said another way, the isolation device 220 may utilize isolation components such as optoelectronic devices (e.g., LEDs, photodetectors, photodiodes, lasers, etc.), capacitive devices (e.g., capacitive plates), inductive devices (e.g., inductors, antennas, etc.), modulators, demodulators, encoders, decoders, driver circuits, and other electrical elements that work together to communicate signals between one another wirelessly, thereby maintaining the isolation boundary 216.

The isolation device 220 includes a first emitter 224 and a second emitter 228 that both communicate optical control signals 240, 244 to a detector 232. In some embodiments, the first emitter 224 is provided in the primary power domain 204 and is used to convert a first electrical control signal in the primary power domain 204 into the first optical control signal 244. This first optical control signal 244 may be transmitted across the isolation boundary 216 where it is received at the detector 232 in the form of photon energy. The second emitter 228 is provided in the third power domain 228 and converts a second electrical control signal in the third power domain 212 into a second optical control signal 240. The second optical control signal 240 is also communicated across the isolation boundary 216 to the secondary power domain 208 where it is detected at the detector 232. Thus, the detector 232 is configured to detect both optical control signals 240, 244 produced by both emitters 224, 228. The detector 232 converts the optical control signals 240, 244 detected thereby into an electrical control signal. The electrical control signal produced by the detector 232 is provided to a detector chip 236 or other amplification device that amplifies the electrical signal produced by the detector 232 prior to placing the electrical control signal onto a control line 248 for the load controller 120. In some embodiments, the emitters 224, 228 may correspond to light emitters (e.g., LED, an array of LEDs, a laser, etc.) and the detector 232 may be a photodiode or similar type of optical transducer.

Because the detector 232 receives optical control signals 240, 244, the electrical control signal produced by the detector 232 will represent a combination of both control signals 240, 244. In other words, the first control signal 244 and second control signal 240 will both contribute to the optical energy received by the detector 232, which is subsequently used to produce the electrical control signal for the load controller 120. Advantageously, if the primary power domain 204 fails or the first emitter 223 otherwise becomes unable to produce the first optical control signal 244, the third power domain, which may be isolated from the primary power domain 204, may still be operable. This effectively means that the detector 232 can still receive an optical control signal, but the sole source of that optical control signal received at the detector 232 will be the second emitter 228 operating in the third power domain 212. As will be discussed in further detail herein, the detector 232 and detector chip 236 may be configured to output an electrical control signal onto the control line 248 that is a combination (e.g., logical function) of the optical control signals 240, 244 produced by the emitters 224, 228. The electrical control signal produced by the detector 232 may correspond to a logical AND, a logical OR, or some other combinational function of the two optical control signals 240, 244.

FIG. 2 also shows the second emitter 228 as being positioned further away from the detector 232 as compared to the first emitter 224. This difference in distance may be calibrated to ensure that the optical control signal 244 produced by the first emitter 224 is stronger in amplitude when received at the detector 232 as compared to the optical control signal 240 produced by the second emitter 228, since the first emitter 224 corresponds to the primary control signal source for the load controller 120. Options regarding the relative placement of the emitters 224, 228 with respect to the detector 232 will be described in further detail below.

In some embodiments, it may be possible to connect both cathode terminals of each emitter 224, 228 together, which effectively creates a common cathode configuration. For example, both emitters 224, 228 may have their cathodes connected on the same lead of a leadframe and, in some embodiments, may be connected to a common ground. This common cathode configuration allows the package of the isolation device 220 to have one less pin as compared to a package that does not utilize a common cathode configuration. The sharing of a cathode pin to a common ground terminal may be possible because both the primary power domain 204 and third power domain 212 are low voltage power domains and are capable of sharing a common ground without destroying or damaging components in either domain. Although FIG. 2 illustrates that the first emitter 224 is located in the primary power domain and the second emitter 228 is located in the third power domain 212, it is understood that the embodiment of FIG. 2 may be modified to include additional emitter(s) being located in additional power domain(s).

Figure 3:
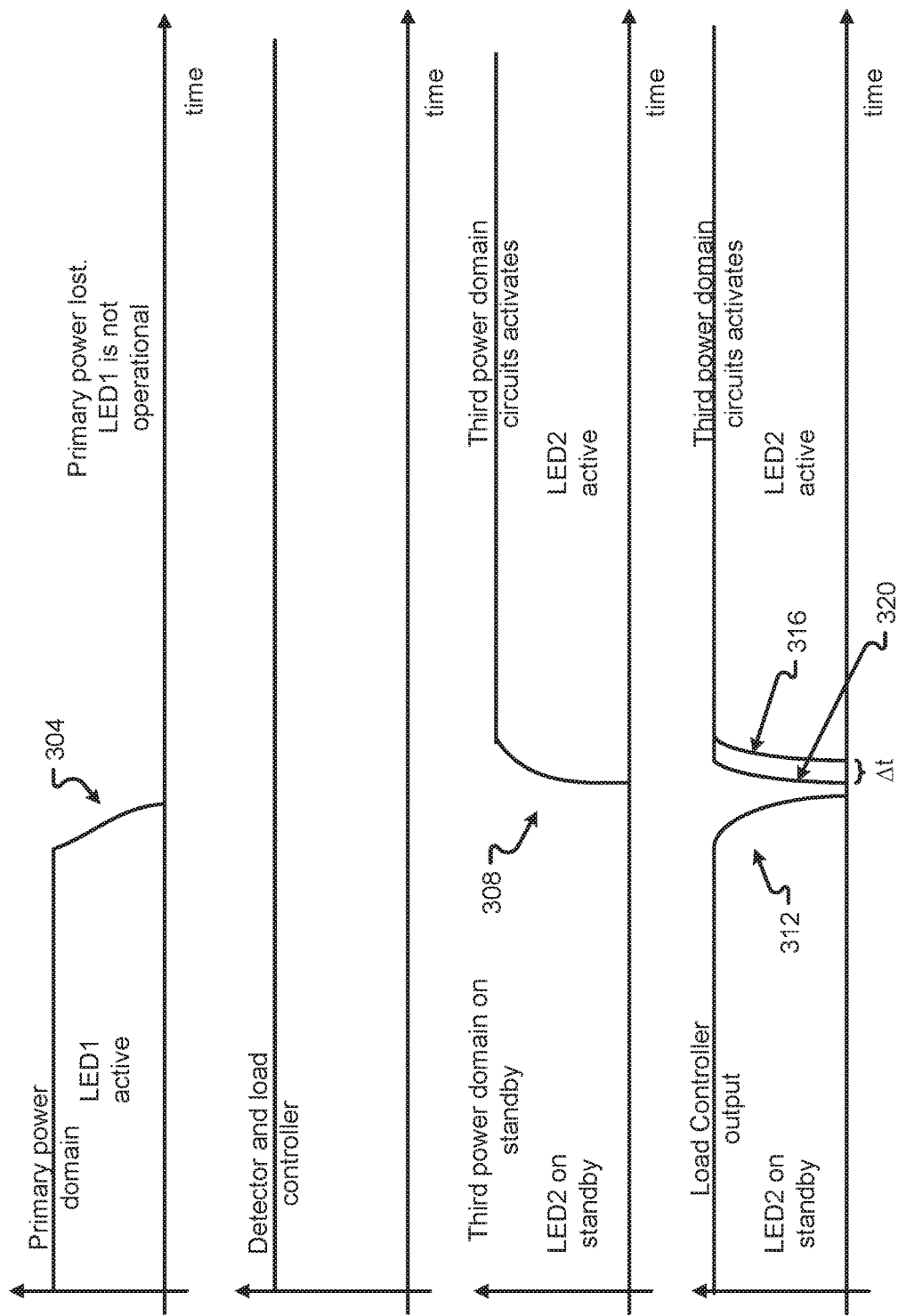
FIG. 3 is a diagram depicting control signals transmitted in an illustrative operating scenario of a fault-tolerant system in accordance with embodiments of the present disclosure.

With reference now to FIG. 3, additional details regarding the operation of a control system 100, 200 will be described in accordance with at least some embodiments of the present disclosure. FIG. 3 depicts a plurality of waveforms that include a first control signal 304, a second control signal 308, a controller output signal prior to failure 312, a control output signal after failure 320 corresponding to FIG. 2, and a controller output signal 316 corresponding to FIG. 1. As can be seen in FIG. 3, the intent is to maintain a substantially constant electrical control signal for the load controller 120. This is a relatively simple task as long as the primary power domain 104, 204 is operational and the emitter operating in that power domain is capable of transmitting an optical control signal to the detector(s). Unfortunately, there exists a possibility of the primary power domain 104, 204 becoming inoperative (e.g., having a failure, short, etc.), in which case the first control signal 304 produced from the primary power domain 104, 204 is lost.

In accordance with at least some embodiments of the present disclosure, when the primary power domain 104, 204 becomes compromised, the load controller may begin to receive an electrical control signal that is driven by the second control signal 308. As a non-limiting example, the second control signal 308 may correspond to an optical control signal produced by an emitter resident in the third power domain 112, 212. Thus, the second control signal 308 may be activated, thereby providing an alternative control signal from the detector and load controller 120.

As shown in the load controller output waveform, the output of the load controller 120 may be substantially constant or controlled when the primary power domain is active and the first control signal 308 is driving the output of the detector(s). Upon failure of the primary power domain, the output of the load controller 120 may be interrupted slightly as the detector switches over to providing its control signal to the load controller 120 based on inputs from the second control signal 308. In particular, the controller output after failure 320 will be driven by the second control signal 308 after the primary power domain 104, 204 becomes inoperative. The second control signal 308 may be used to continue operating the load in lieu of the first control signal 304. Alternatively, the second control signal 308 may be used to safely shut down the load that is being controlled by the load controller 120. Because the second control signal 308 is already being provided to the detector(s), it is possible for the output of the load controller 320 to quickly switch itself to becoming responsive to the second control signal 308. Compare this scenario to one in which an additional control signal is not produced by a second emitter or a scenario in which a second emitter is not already operating prior to failure in the primary power domain 104, 204 and it can be seen that the output of the load controller in such a scenario 316 corresponding to FIG. 1 will be delayed, which may be useful for operating conditions not requiring critical response time. For instance, if the load controller 120 is being used to control large industrial equipment, such as a large 3-phase motor, then the motor will spin and operate out of control until such time as the load controller 120 is able to receive a new control signal. This delay in time is represented as the time difference Δt, which shows that the load controller output 316 corresponding to FIG. 1 may be delayed as compared to a load controller output according to embodiments of the present disclosure 320 corresponding to FIG. 2. The response time of the load controller 120 is faster according to embodiment of FIG. 2 which is desirable for operating conditions requiring critical response time as compared to the embodiment of FIG. 1 due to a shorter signal path and due to an architecture that provides a ready source of an alternative control signal in case the primary power domain 104, 204 fails.

Figure 4A:
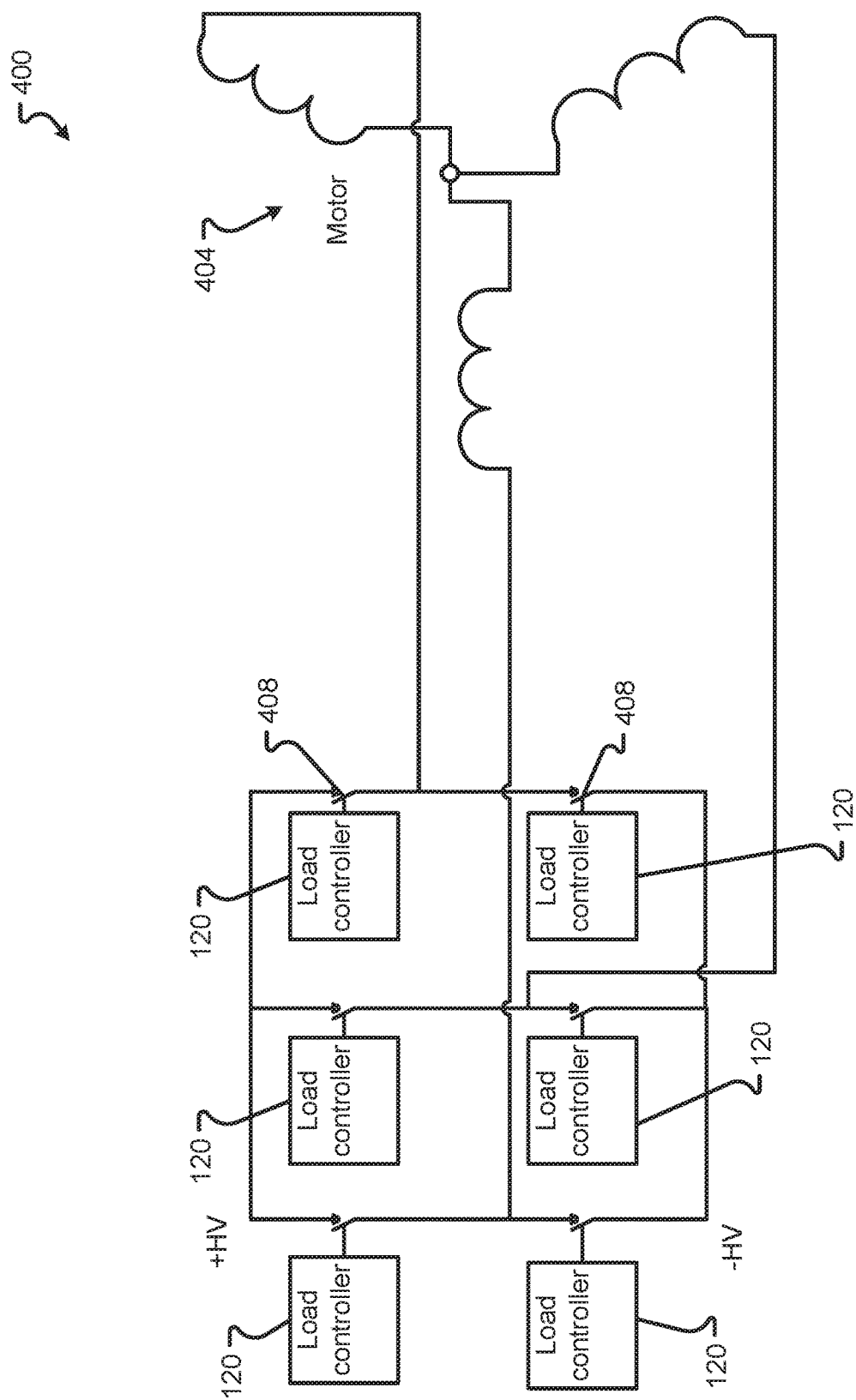
FIG. 4A is a diagram depicting load controllers and a 3-phase motor during normal operations in accordance with embodiments of the present disclosure.
Figure 4B:
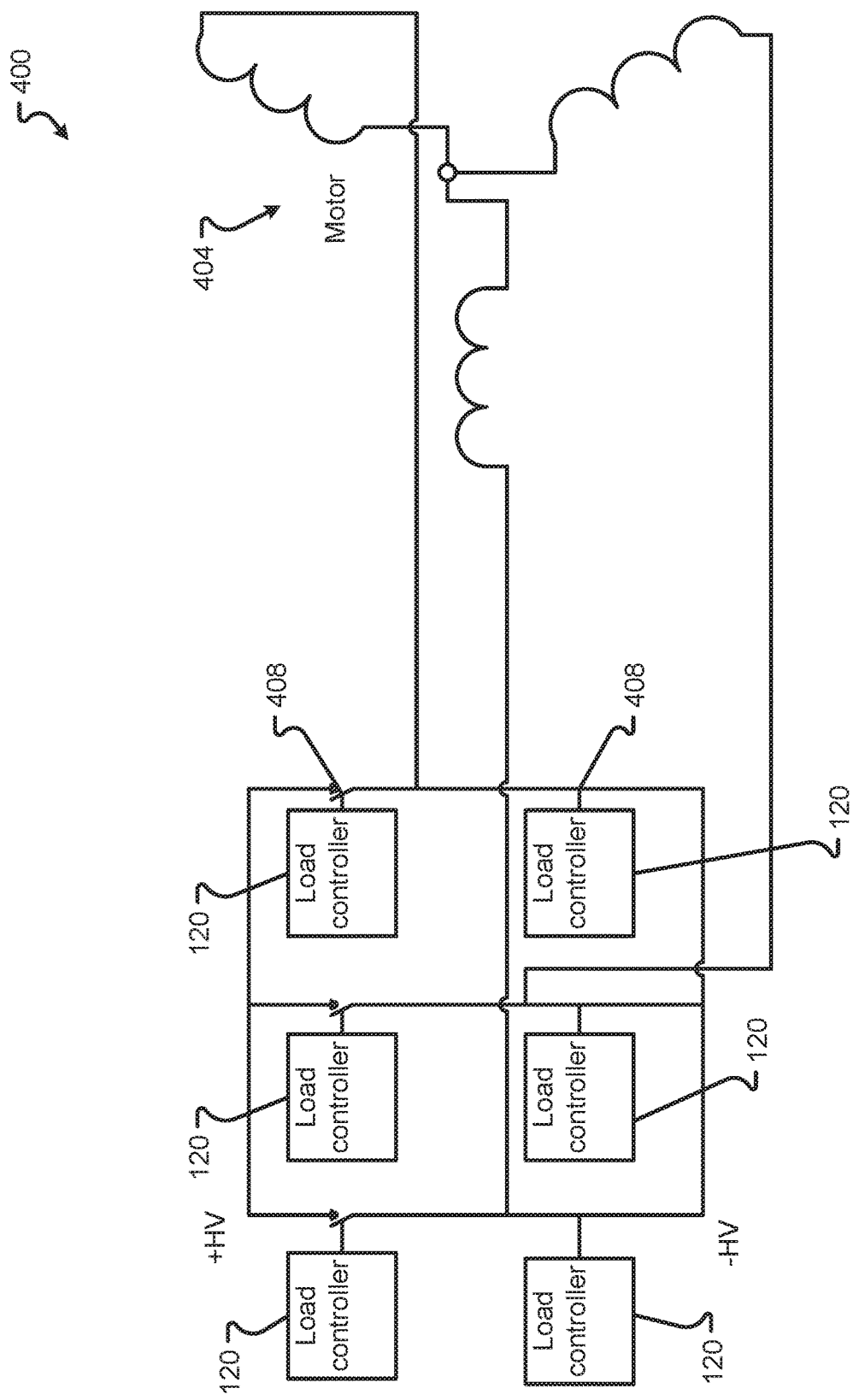
FIG. 4B is a diagram depicting load controllers and a 3-phase motor during safe shut down of the 3-phase motor in accordance with embodiments of the present disclosure.

FIGS. 4A and 4B depict details of a control system 400 in accordance with embodiments of the present disclosure. The control system 400 is shown to include a motor 404 as one example of a load that is controlled by a plurality of load controllers 120. As can be appreciated, each load controller 120 may be separately controlled by different control signals. Said another way, each load controller 120 may be in communication with a separate isolation device or may receive outputs from different detectors of different isolation devices. Alternatively, two or more of the load controllers 120 may be connected to a common isolation device, in which case the load controllers 120 are receiving the same control signal. In some embodiments, the load controller 120 may be considered to be operating within a secondary power domain 108, 208 even though the load controller 120 are receiving their control signals from a low-voltage power domain such as a primary power domain 104, 204 or third power domain 112, 212.

The load controllers 120 are each shown to be switchably connected to the 3-phase motor 404 through one or more switches 408. Each switch 404 may control whether a particular load controller 120 is connected to the motor 408 or not. In some embodiments, operation of the switch(es) 408 may be partially or completely controlled by control signals originating from the primary power domain 104, 204 or third power domain 112, 212. Thus, in the event of a primary power domain 104, 204 failure, control circuitry in the third power domain 112, 212 may be providing control signals to the switches 408, that enable the motor 404 to be shut down in a controlled and safe manner. In some embodiments, the switches 408 correspond to transistors, such as IGBTs.

In a prior art inverter system used to control a 3-phase motor, for example, a catastrophic over-stress event on the primary power domain 104, 204 may destroy the ability to control the gates of the switches 408. In this case, all the switches will be open. Due to electric current remaining in the windings, the motor 404 will continue running, which may pose a significant safety risk.

In a safe shutdown system according to embodiments of the present disclosure, the ability of the primary power domain 104, 204 to control the gates of the switches may be monitored (for example through motor RPM, IGBT collector current). When a primary power domain failure is detected, the third power domain 112, 212 controller may turn on the emitter(s) resident therein to begin controlling bottom arms of the switches 408. When the switches are turned-on as shown in FIG. 4B, this will allow the current to flow down to the negative power rail, effectively braking the motor.

Figure 5:
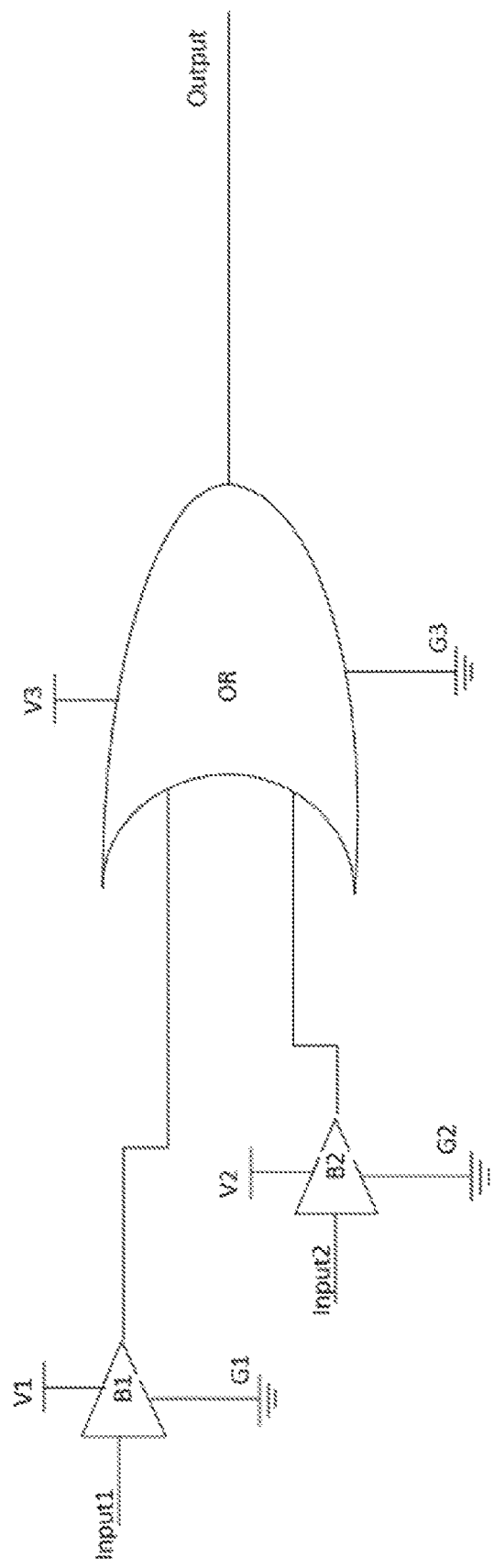
FIG. 5 is a diagram depicting logical representations of components in a control system in accordance with embodiments of the present disclosure.

With reference now to FIG. 5, a diagram depicting a logical representation of components in a control system will be described in accordance with embodiments of the present disclosure. The system is shown to include a first input control signal (e.g., Input1) and a second input control signal (e.g., Input2). The first input control signal is provided to a first amplifier B1 that is connected to a first power supply V1 and a first ground G1 whereas the second amplifier B2 is connected to a second power supply V2 and a second ground G2. In some embodiments, the signal emitted by the first amplifier B1 would functionally equivalent to an optical control signal emitted by a first emitter, except that the first emitter would be electrically isolated from the OR gate (e.g., the signal receiver). Likewise, the signal emitted by the second amplifier B2 would be functionally equivalent to an optical control signal emitted by a second emitter, except that the second emitter would be electrically isolated from the OR gate (e.g., the signal receiver). A schematic representation of such emitter components are shown in detail in FIG. 7.

Figure 7:
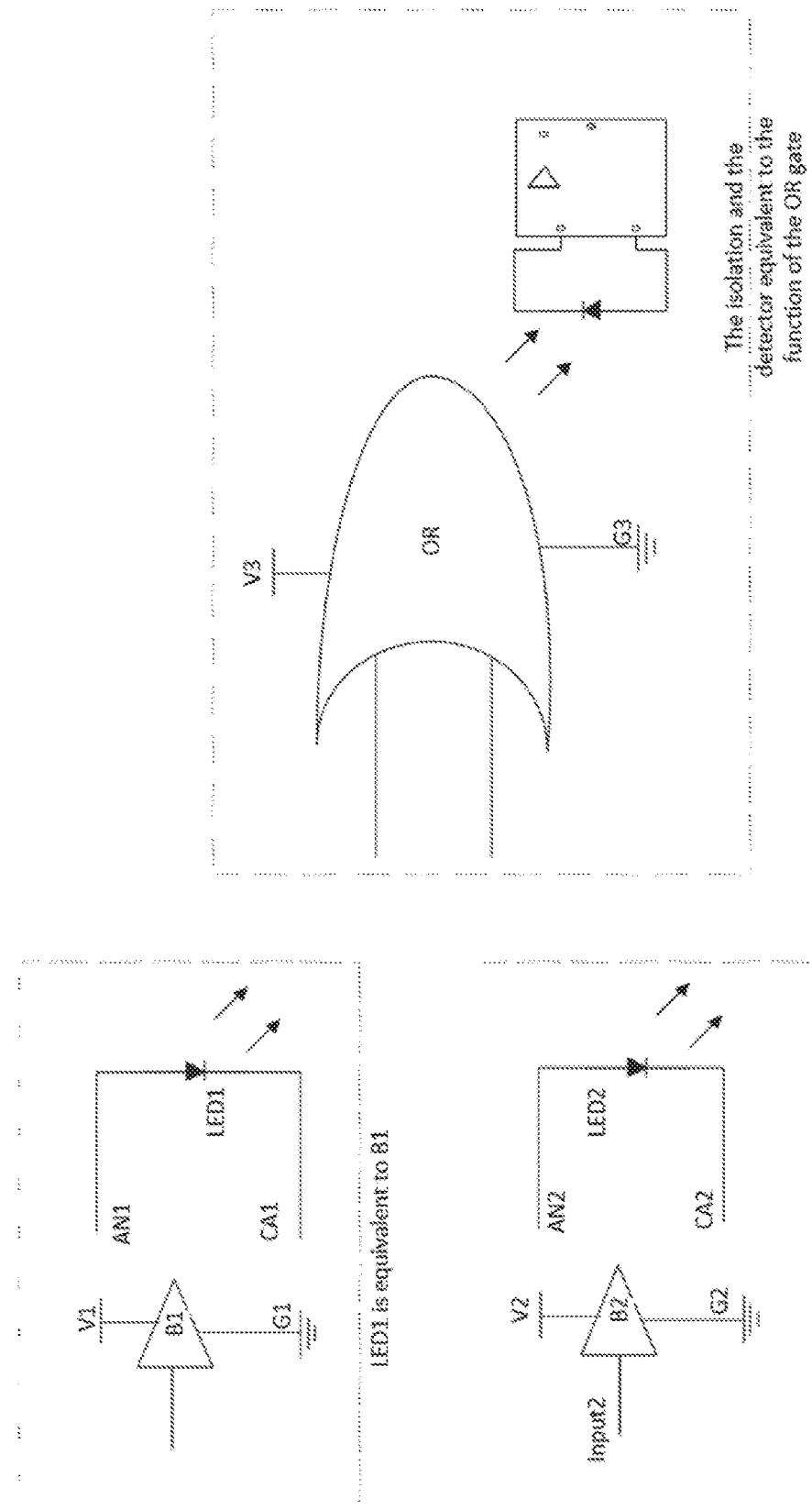
FIG. 7 is a diagram depicting logical representations and circuit equivalents of components in a control system in accordance with embodiments of the present disclosure.

For ease of conversation and referring back to FIG. 5, the OR gate receives the control signals from both inputs. When the OR gate picks up the voltages at both of its input, a combination of those signals will be produced at the output. Since this particular example of the OR gate is shown as not being electrically isolated form the inputs, the input voltage should be between the third ground G3 and the supply voltage of the OR gate V3. If the input voltages at the OR gate were larger than V3 or lower than G3, the OR gate would become electrically overstressed and would potentially suffer a breakdown. This is why an electrically isolated system such as the one shown in FIG. 7 is useful.

Figure 6:
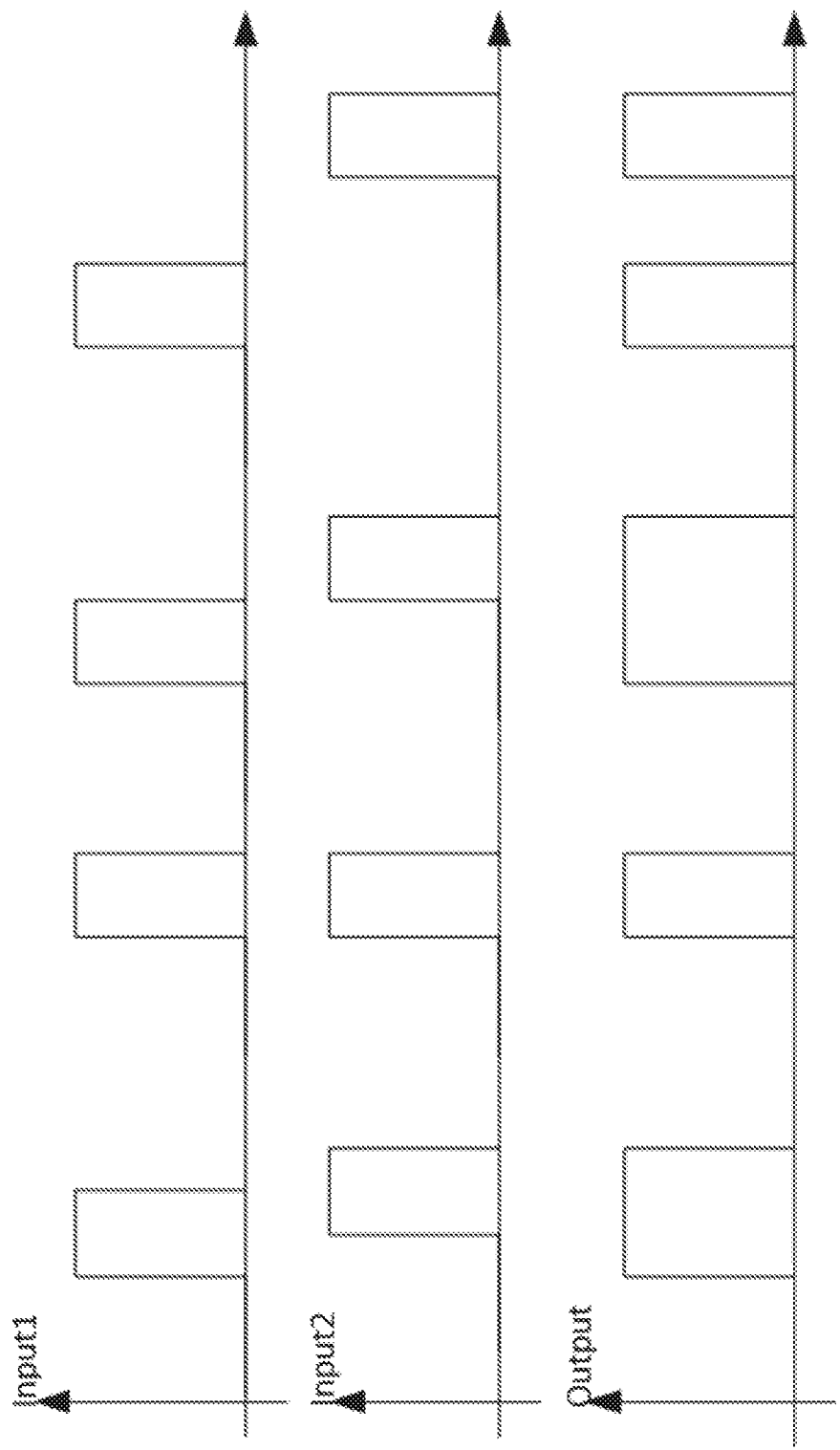
FIG. 6 is a diagram depicting logic states for the diagram of FIG. 5.

As can be seen with reference to FIG. 6, the output signal may correspond to a combination of the first input signal Input1 and the second input signal Input2 (e.g., an OR combination of the two input signals). FIG. 7 depicts a system in which the input components are electrically isolated from the receiving component of the OR gate. In particular, the first input Input1 is shown as being provided to a first emitter LED1 and the second input Input2 is shown as being provided to a second emitter LED2. The first emitter LED1 includes a first anode AN1 and a first cathode CA1 whereas the second emitter LED2 includes a second anode AN2 and a second cathode CA2. As discussed above, the cathodes CAL CA2 may be connected to a common leadframe terminal in accordance with embodiments of the present disclosure. The first and second emitters LED1, LED2 produce first and second optical control signals that are emitted across an isolation boundary to the logical OR gate. In the depicted embodiment, the OR gate corresponds to a functional equivalent of the detector(s) 140, 152, and/or 232. The grounds G1, G2, G3 do not need to be the same since each of the different power domains may be electrically isolated from one another. Furthermore, the supply voltage for the OR gate V3 may be significantly higher (e.g., an order of magnitude higher or more) than the supply voltages V1, V2. However, the output of the OR gate may correspond to a combination of the optical control signals emitted by the emitters LED1, LED2. Although the detector is shown as being functionally equivalent to an OR gate, it should be appreciated that the detector could be functionally equivalent to an AND gate, a NAND gate, a NOR gate, or the like.

Figure 8:
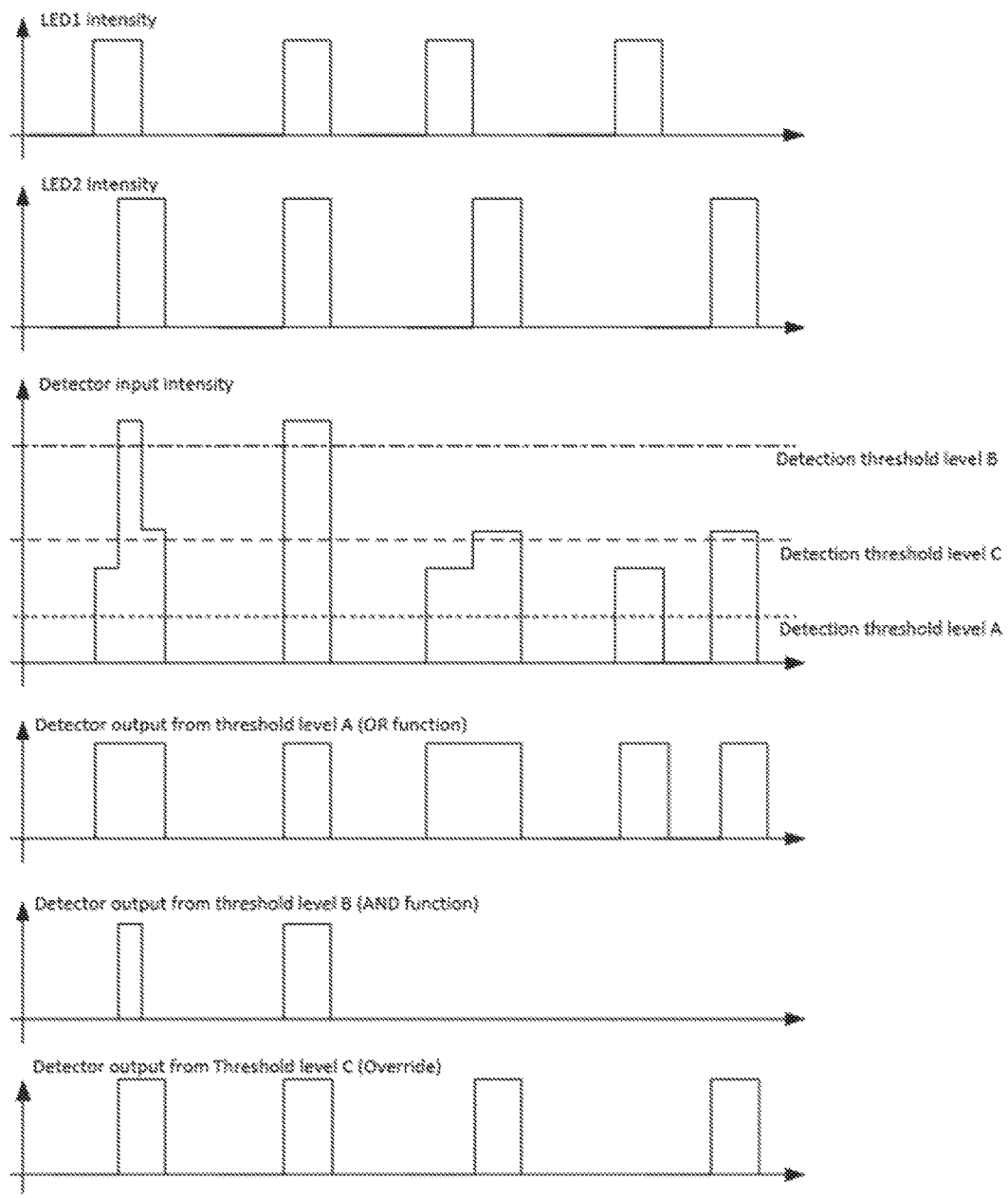
FIG. 8 is a diagram depicting control signals transmitted via the control system of FIG. 2.

With reference now to FIG. 8, additional details of the input signals and output signals are depicted. The first emitter LED1 may produce a first control signal having a first intensity. This control signal may be transmitted intermittently and the intensity of the signal may be measured according to brightness or some other measure of an optical signal's intensity. The second emitter LED2 may produce a second control signal having a second intensity, that may be the same as or different from the first control signals intensity. Additionally, the periodicity of the second control signal does not necessarily have to coincide with that of the first control signal. In some embodiments, the intensity of the second control signal is smaller than the intensity of the first control signal because the second emitter LED2 is further away from the detector as compared to the first emitter LED1.

The third waveform of FIG. 8 depicts the detector input intensity, which corresponds to an addition of the first and second control signals. As shown, when both control signals are received at the detector, the input intensity is greater than if only one control signal is received. Thus, the detector or some circuitry connected to the detector may be configured to compare the input intensity to one, two, three, or more different intensity thresholds to help determine an appropriate output for the detector. In some embodiments, the detector input intensity is compared to a first detection threshold level A, a second detection threshold level B, and a third detection threshold level C.

Application of the first detection threshold level A to the detector input intensity can help produce a first detector output, which may correspond to an OR function. The first detection threshold level A may be selected such that it is at least as large as either the expected intensity created by the first control signal or the second control signal.

Application of the second detection threshold level B to the detector input intensity can help produce a second detector output, which may correspond to an AND function. In this example, the second detection threshold level B is larger than an expected intensity created by the first control signal as well as an expected intensity created by the second control signal; however, the second detection threshold level B is smaller than a sum of the expected intensities created by both control signals.

Application of the third detection threshold level C to the detector input intensity can help produce a third detector output, which may correspond to an override output. In this example, the third detection threshold level is chosen to be less than one of the expected intensities created by one control signal but larger than the other of the expected intensities. This helps create a detector output that is a combination of the two control signals, but that favors a particular control signal over the other.

With reference now to FIGS. 9A-11B, examples of various isolation device configurations will be described in accordance with at least some embodiments of the present disclosure. As can be appreciated, the isolation devices depicted and described herein can be used in any of the control systems depicted and described herein. Moreover, these various isolation devices should not be construed as the only types of isolation devices that can be used in a control system as depicted and described. Rather, embodiments of the present disclosure contemplate that an isolation device may have features in common with one or many of the isolation devices depicted and described herein. The examples discussed herein are merely used as illustrative embodiments.

Figure 9A:
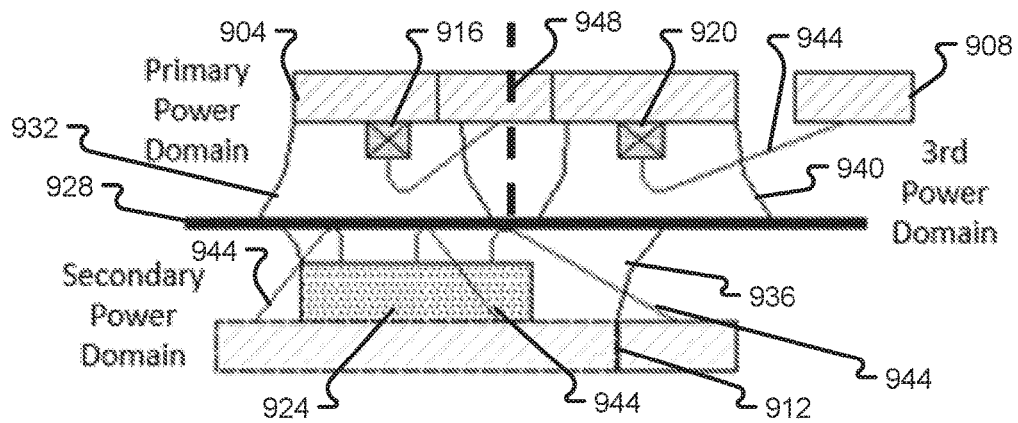
FIG. 9A is a cross-sectional view of a first illustrative isolation device in accordance with embodiments of the present disclosure.
Figure 9B:
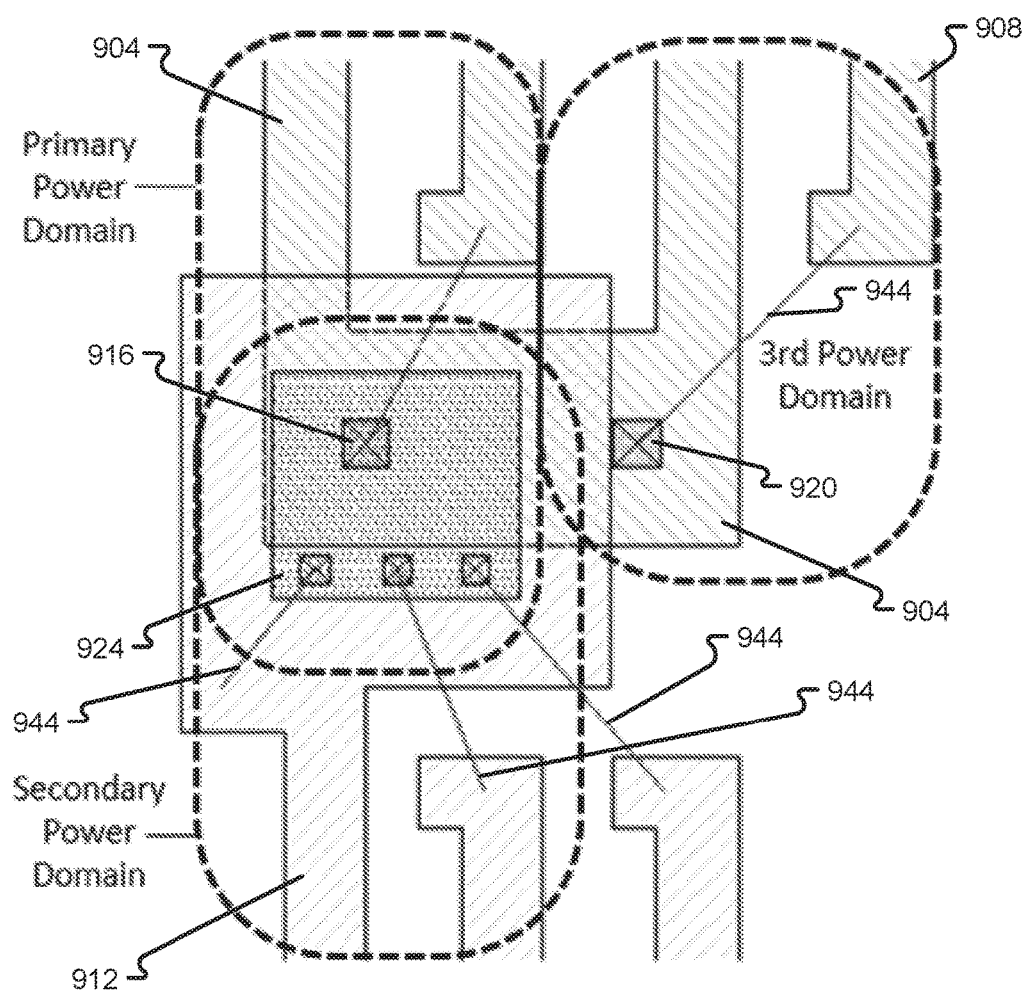
FIG. 9B is a top view of the first illustrative isolation device from FIG. 9A.

Referring initially to FIGS. 9A and 9B, a first isolation device configuration will be described in accordance with at least some embodiments of the present disclosure. The isolation device is shown to include a first leadframe portion 904, an auxiliary leadframe portion 908, and a second leadframe portion 912. The second leadframe portion 912 is separated from the other leadframe portions 904, 908 by an isolation barrier 928. As can be appreciated, the second leadframe portion 912 may be connected to circuitry, supply voltages, and/or ground terminals in the second power domain whereas the other leadframe portions 904, 908 may be connected to circuitry, supply voltages, and/or ground terminals in the primary and/or third power domains. Accordingly, the isolation barrier 928 is used to ensure that current does not pass between the second leadframe portion 912 and the other leadframe portions 904, 908. In some embodiments, the isolation barrier 928 corresponds to an electrically insulative sheet of material, film, tape, or the like. A more specific example of the isolation barrier 928 is an insulative tape, such as Kapton® tape. As an even more specific example, the isolation barrier 928 may correspond to a 25 um or 50 um thick tape having silicone adhesive on both sides thereof.

In the depicted embodiment, the first leadframe portion 904 has a first emitter 916 and second emitter 920 mounted on a surface thereof that is facing toward the isolation barrier 928. In this example, both emitters 916, 920 are mounted on a common leadframe portion, but are connected to different ground terminals (e.g., other portions of the leadframe) with different wirebonds 944. This particular configuration may correspond to the shared cathode example discussed in detail hereinabove. Furthermore, because both emitters 916, 920 are mounted on a common leadframe portion, the light-emitting surface of both emitters 916, 920 are substantially co-planar (e.g., a same distance from the isolation barrier 928). In the depicted embodiment, an imaginary isolation boundary 948 exists between the first emitter 916 and second emitter 920 by virtue of the fact that the emitters 916, 920 are connected to different ground terminals. However, this particular embodiment does not provide a physical structure to restrict electrical current from passing between the power domains. Rather, because both the primary power domain and third power domain are similar in magnitude, there is no need to physically separate the two power domains with a physical structure. Instead, a simple gap provided between encapsulant materials may be sufficient to create a partial isolation boundary 948.

Both the first emitter 916 and second emitter 920 are encapsulated and surrounded by a first encapsulant material 932 and a third encapsulant material 940. It should be appreciated that these encapsulant materials 932, 940 may correspond to a continuous and uninterrupted deposit of the same material. Alternatively, as depicted, the first encapsulant material 932 may correspond to a first discrete deposit of material whereas the third encapsulant material 940 may correspond to a second discrete deposit of material that is physically separated from the first encapsulant material 932. The encapsulant materials 932, 940 may correspond to optically transparent materials, at least at the wavelengths of light emitted by the emitters 916, 920. The encapsulant materials 932, 940 may, however, be electrically insulative.

In the depicted embodiment, the deposit of insulative material forming the encapsulant materials 932, 940 extends from the bonding surface of the first leadframe portion 904 all the way to the upper surface of the isolation barrier 928. In some embodiments, the encapsulant material 932, 940 directly physically contacts the isolation barrier 928. However, because the encapsulant material 932, 940 is electrically insulative, there is little or no risk associated with transient currents flowing through the encapsulant material 932, 940 and isolation barrier 928. As a non-limiting example, the encapsulant materials 932, 940 may correspond to one or more deposits of silicone, epoxy, or similar transparent/translucent polymer compounds. In some embodiments, the insulative properties of the isolation barrier 928 are greater than the insulative properties of the encapsulant materials 932, 940.

On the opposing side of the isolation barrier 928 and located in the secondary power domain, a detector 924 may be mounted on a mounting surface of the second leadframe portion 912. As a non-limiting example, the detector 924 may correspond to an Integrated Circuit (IC) chip having a photosensitive area located on a top/exposed surface thereof. The detector 924 may include the amplification circuitry used to amplify the electrical signal produced by the photosensitive area of the IC chip. In such an embodiment, the photosensitive area of the detector 924 may be larger than the light-emitting surface of the first emitter 916.

In some embodiments, the detector 924 is mounted on a surface of the second leadframe portion 912 that faces toward the isolation barrier 928 as well as the emitters 916, 920. Such a configuration helps to establish a face-to-face relationship between the detector 924 and the emitters 916, 920. As shown in the top view of FIG. 9B, the first emitter 916 may substantially overlap with the photosensitive area of the photodetector 924. In this way, optical control signals emitted by the first emitter 916 travel substantially orthogonal to the light-emitting surface of the first emitter 916 and impact the detector 924 substantially orthogonal to the photosensitive surface of the detector 924. The second emitter 920, on the other hand, is offset relative to the detector 924. This offset configuration still enables the second emitter 920 to communicate an optical control signal to the detector 924 while ensuring that the optical control signal emitted by the second emitter 920 does not override or displace the optical control signal emitted by the first emitter 916. Said another way, the second emitter 920 may be considered to have a diagonal orientation relative to the detector 924 whereas the first emitter 916 may be considered to have a substantial alignment (e.g., direct and substantially orthogonal) with the photosensitive surface of the detector 924. Thus, a vertical axis extending substantially orthogonally with respect to the face of the detector may intersect the first emitter 916, but not intersect the second emitter 920. This difference in orientation may result in the second emitter 920 being at least two times further away from the detector 924 as compared to the first emitter 916. It may also be possible to establish a distance between the second emitter 920 and detector 924 that is three times greater than a distance between the first emitter 916 and detector 924.

The detector 924 is also shown to be encapsulated by an encapsulant material. In particular, the detector 924 is shown to be encapsulated by a second encapsulant material 936. The second encapsulant material 936 may be similar or identical in nature to the first encapsulant material 932 or the third encapsulant material 940 except that the second encapsulant material 936 is deposited on the opposite side of the isolation barrier 928. The second encapsulant material 936 may substantially cover and surround the detector 924. Furthermore, in embodiments where the detector comprises an IC chip having a plurality of wirebonds 944, the second encapsulant material 936 may partially encapsulate portions of each of those wirebonds 944. In some embodiments, an optical path between the first emitter 916 and detector 924 passes through the first encapsulant material 932 and the second encapsulant material 936. Likewise, a separate optical path between the second emitter 920 and detector 924 passes through the third encapsulant material 940 and second encapsulant material 932. The optical path between the first emitter 916 and detector 924 does not necessarily pass through the third encapsulant material 940.

Although not depicted, the first leadframe portion 904 and auxiliary leadframe portion 908 may belong to a first set of leads that extend from a first side of a semiconductor package. The second leadframe portion 912 may belong to a second set of leads that extend from an opposite side of the same semiconductor package. The leads of the semiconductor package may be encapsulated in an optically opaque molding material that substantially surrounds all of the other components of the isolation device depicted and described herein.

Figure 10A:
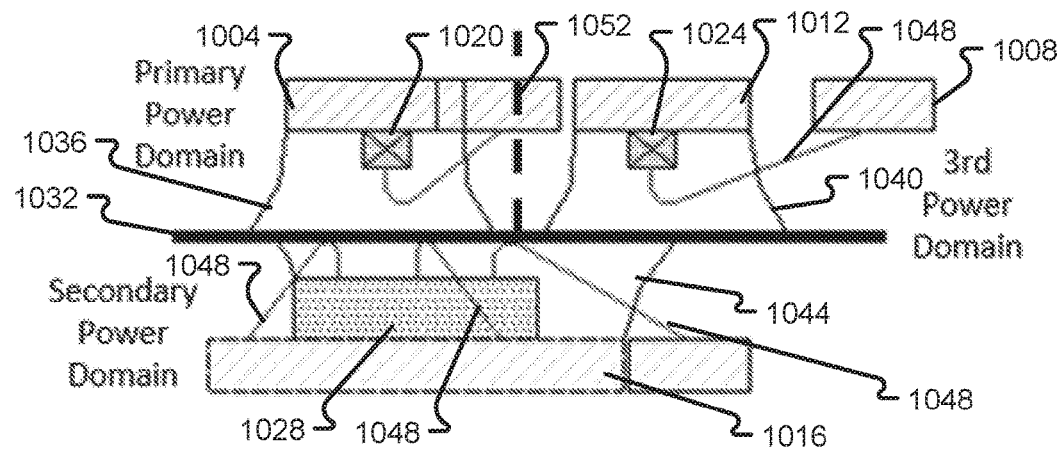
FIG. 10A is a cross-sectional view of a second illustrative isolation device in accordance with embodiments of the present disclosure.
Figure 10B:
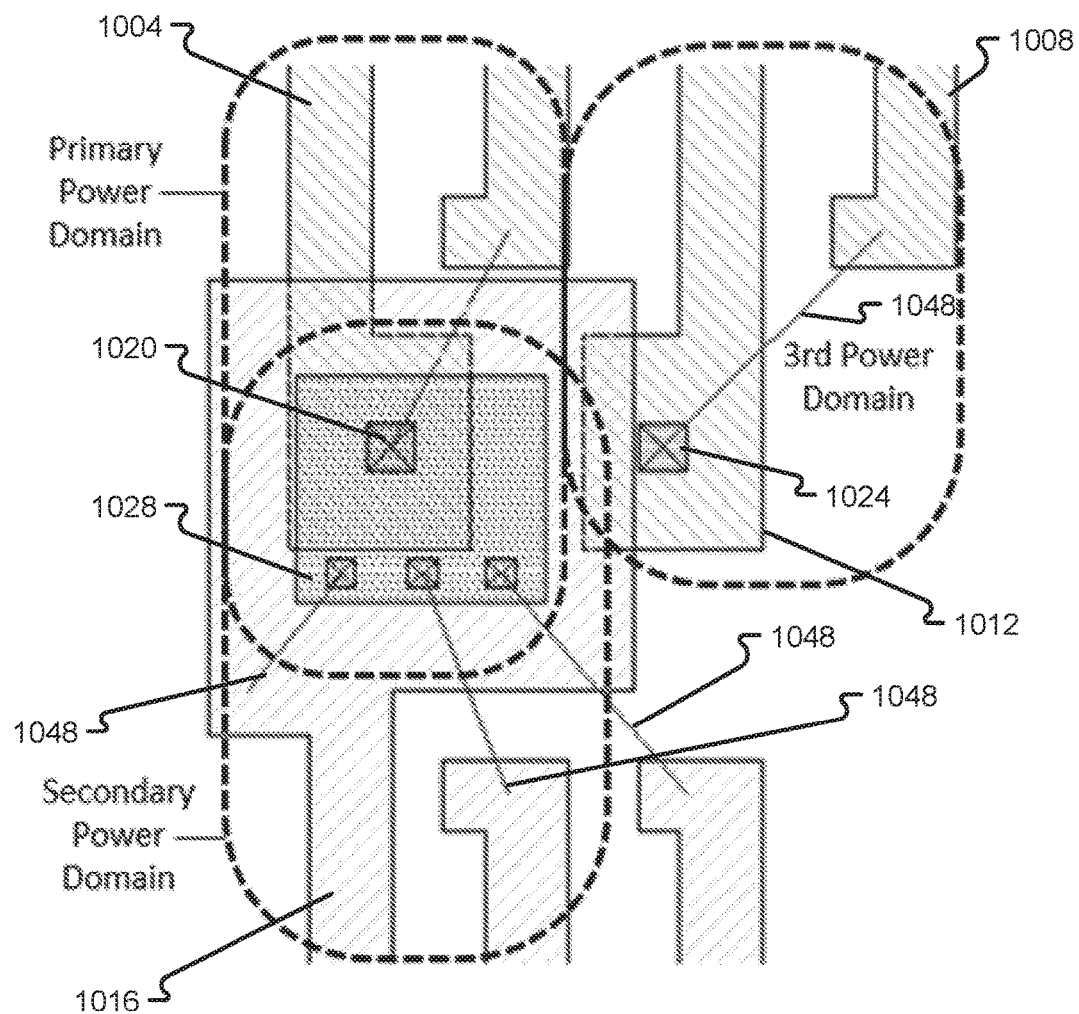
FIG. 10B is a top view of the second illustrative isolation device from FIG. 10A.

With reference now to FIGS. 10A and 10B, a second isolation device configuration will be described in accordance with at least some embodiments of the present disclosure. The isolation device of this example is shown to include a first leadframe portion 1004, an auxiliary leadframe portion 1008, a separate bonding pad 1012, and a second leadframe portion 1016. The second leadframe portion 1016 is separated from the other leadframe portions 1004, 1008, 1012 by an isolation barrier 1032. As can be appreciated, the second leadframe portion 1016 may be connected to circuitry, supply voltages, and/or ground terminals in the second power domain whereas the other leadframe portions 1004, 1008, 1012 may be connected to circuitry, supply voltages, and/or ground terminals in the primary and/or third power domains. Accordingly, the isolation barrier 1032 is used to ensure that current does not pass between the second leadframe portion 1016 and the other leadframe portions 1004, 1008, 1012.

The isolation barrier 1032 may be similar or identical to isolation barrier 928. Likewise, the leadframe portions 1004, 1008, 1012, 1016 may be similar to the leadframe portions 904, 908, 912. One noticeable difference, however, is that the leadframe in the primary power domain and third power domain is separated such that the first emitter 1020 and second emitter 1024 are mounted to separate bonding pads 1004, 1012, respectively. Accordingly, in this example, the emitters 1020, 1024 do not share a common electrical node. This may facilitate an architecture where the different power domains each have different supply voltages and different ground potentials.

In the depicted embodiment, a first encapsulant material 1036 is used to encapsulate the first emitter 1020 and a third encapsulant material 1040 is used to encapsulate the second emitter 1024. The encapsulant material 1036 may be similar or identical to encapsulant material 932 while the encapsulant material 1040 may be similar or identical to encapsulant material 940. The third encapsulant material 1040 may be directly physically connected to the separate bonding pad 1012 and the isolation barrier 1032. Similarly, the first encapsulant material 1036 may be directly physically connected to the first leadframe portion 1004 and isolation barrier 1032. The gap between the encapsulant materials 1036, 1040 may result in an isolation boundary 1052 between the primary power domain and third power domain.

The isolation barrier 1032 protects both of these power domains from the secondary power domain, which may be operating at a substantially higher voltage.

Like the second encapsulant material 936, a second encapsulant material 1044 may be used to encapsulate the detector 1028, which is mounted directly on the face of the second leadframe portion 1016 that is pointing toward the isolation barrier 1032. Aside from the separated bonding pads for the emitters 1020, 1024, this particular example of an isolation device is similar to the isolation device of FIGS. 9A and 9B. Indeed, a same number of wirebonds 1048 are shown in both devices and the relative configurations of the detector 1028, first emitter 1020, and second emitter 1024 are similar to those of the detector 924, first emitter 916, and second emitter 920.

Figure 11A:
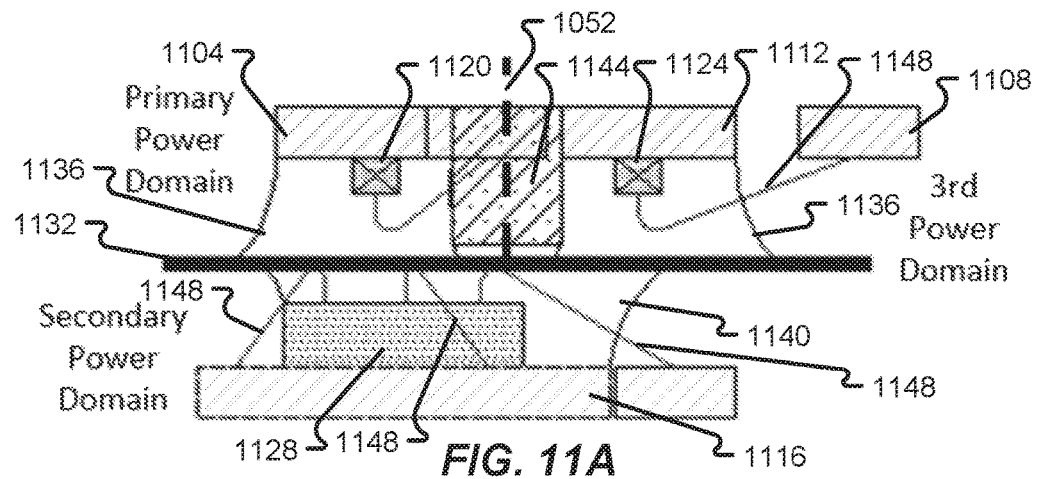
FIG. 11A is a cross-sectional view of a third illustrative isolation device in accordance with embodiments of the present disclosure.
Figure 11B:
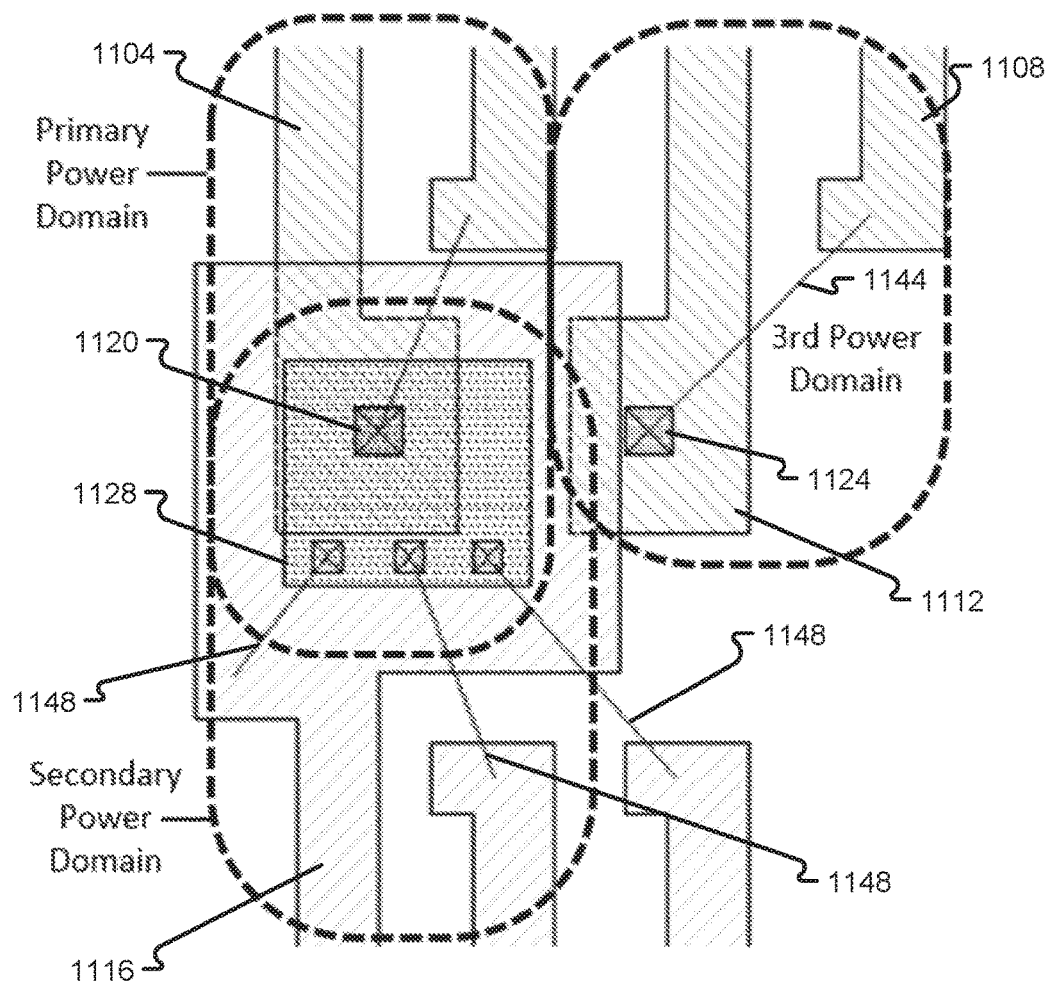
FIG. 11B is a top view of the third illustrative isolation device from FIG. 11A.

With reference now to FIGS. 11A and 11B, a third isolation device configuration will be described in accordance with at least some embodiments of the present disclosure. The isolation device of this example is shown to include a first leadframe portion 1104, an auxiliary leadframe portion 1108, a separate bonding pad 1112, and a second leadframe portion 1116. The second leadframe portion 1116 is separated from the other leadframe portions 1104, 1108, 1112 by an isolation barrier 1132. As can be appreciated, the second leadframe portion 1116 may be connected to circuitry, supply voltages, and/or ground terminals in the second power domain whereas the other leadframe portions 1104, 1108, 1112 may be connected to circuitry, supply voltages, and/or ground terminals in the primary and/or third power domains. Accordingly, the isolation barrier 1132 is used to ensure that current does not pass between the second leadframe portion 1116 and the other leadframe portions 1104, 1108, 1112.

Configurations and relative positions of leadframe portions 1104, 1108, 1112, 1116 as well as configurations of other components such as the first emitter 1120, second emitter 1124, and detector 1128 are similar to those shown in FIGS. 10A and 10B. This isolation device differs from previously-described isolation devices in that the isolation device is further shown to include an electrical insulator 1144 positioned between the first emitter 1120 and second emitter 1124. The electrical insulator 1144 may correspond to a physical component that further helps to establish and maintain the isolation boundary 1052 between the primary power domain and third power domain. The electrical insulator 1144 may correspond to an optically transparent or translucent piece of plastic, glass, or sapphire that extends the thickness of the leadframe portions 1104, 1108, 1112 all the way to the top surface of the isolation barrier 1132. The electrical insulator 1144 may have a substantially uniform thickness along its length as shown or it may have a variable thickness (e.g., thicker or skinnier at one side as compared to the other side) without departing from the scope of the present disclosure.

In the depicted embodiment, a first encapsulant material 1136 is used to encapsulate the first emitter 1120 as well as the second emitter 1124. Thus, it may be possible to utilize a single discrete deposit of encapsulant material to encapsulate both emitters if some other structure is positioned between the emitters. The encapsulant material 1136 may be similar or identical to encapsulant material 1036.

Like the second encapsulant material 1044, a second encapsulant material 1140 may be used to encapsulate the detector 1128, which is mounted directly on the face of the second leadframe portion 1116 that is pointing toward the isolation barrier 1132. The isolation device is also shown to include a plurality of wirebonds 1148 that facilitate an electrical connection between the optoelectronic components (e.g., emitters and detectors) and the leadframe portions.

Figure 12:
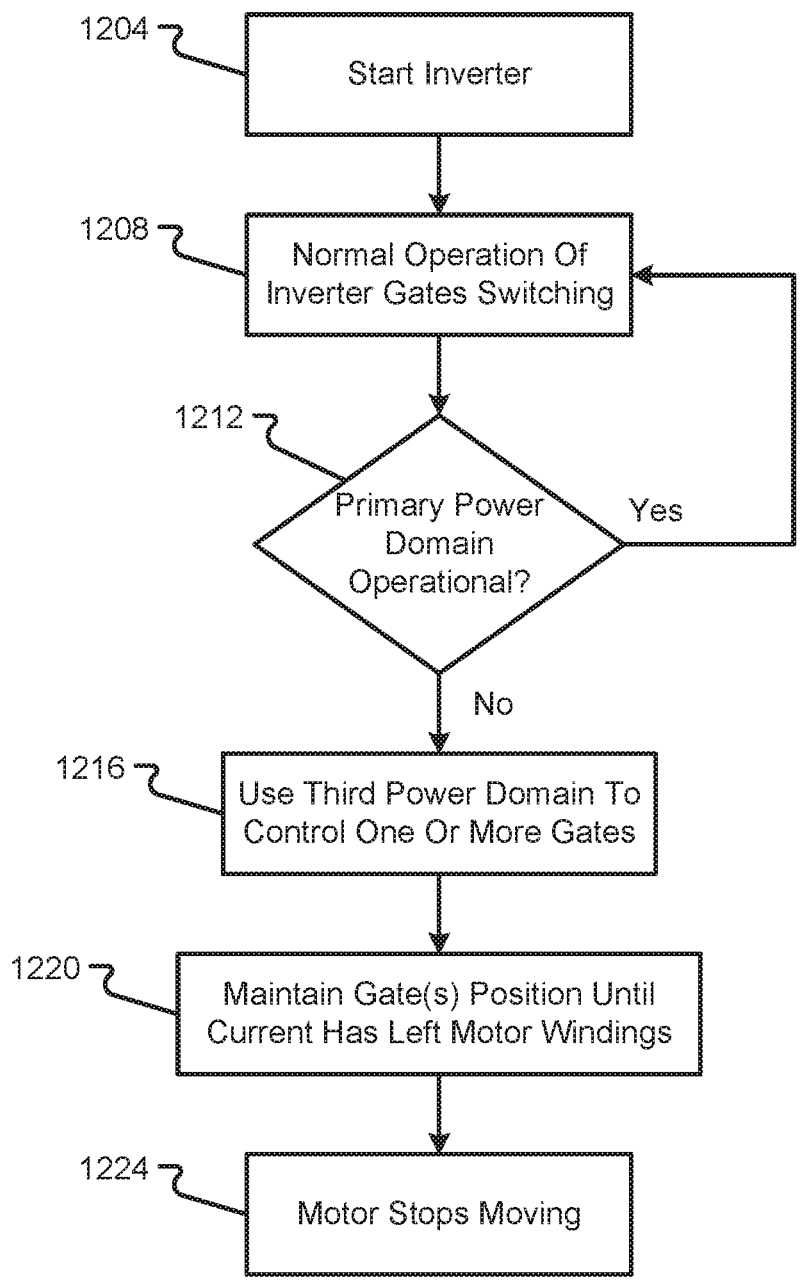
FIG. 12 is a flow diagram depicting a method of operating a control system in accordance with embodiments of the present disclosure.

With reference now to FIG. 12, a method of operating a control system in which one or a plurality of load controllers are used to control operation of a load (e.g., a 3-phase motor) in a second power domain based on control signals issued in other power domains will be described in accordance with at least some embodiments of the present disclosure. The method begins by starting an inverter in the second power domain to begin providing power to the load (step 1204).

The method continues by implementing a normal operation of the inverter gates (step 1208). In this step, one or more control signals may originate from a controller operating in a primary power domain. The control signals issued by the controller may be provided to one or multiple different emitters operating in the primary power domain and/or a third power domain. The emitter(s) may respond to the electrical control signal(s) received from the controller by producing corresponding optical control signals. These optical control signals may be transmitted across an isolation boundary where they are received in the secondary power domain, which may correspond to a same power domain in which the inverters are operating. Thus, the inverter gates will continue to experience normal switching operations as long as the primary power domain remains operational (step 1212).

If the primary power domain becomes inoperable or otherwise fails, the method will continue by utilizing one or more emitters in the third power domain to provide optical control signals to a detector in the secondary power domain. In this scenario, the detector will use the optical control signals issued in the third power domain to control one or more inverter gates in the secondary power domain (step 1216). As a non-limiting example, the control signals issued after the primary power domain has become inoperable may correspond to safe shutdown control signals that cause the load controller to maintain one or more specific inverter gate positions until some or all current has left the load (step 1220). For instance, one or more inverter gates may be maintained in a particular position (e.g., opened or closed as appropriate) until some or all current has left the windings of the 3-phase motor. Once a sufficient amount of current has been removed from the windings, the motor will discontinue movement (step 1224). As can be appreciated, this particular type of control method may enable a safe shutdown of the motor in the event of the primary power domain becoming inoperable.

As can be appreciated, any of the isolators or isolation devices depicted and described herein may be implemented as on-chip solutions (e.g., as a single silicon wafer). In some embodiments, the isolators or isolation devices may be implemented in an Integrated Circuit (IC) chip having other circuit elements provided therein. Moreover, the terms isolator and isolation device may be interchangeable terms as used herein. Indeed, any system, system component, or specific device exhibiting features and/or functions of an electrical isolator as well as an optical coupler may be considered either an isolator or isolation device. Furthermore, any type of galvanic isolation component may benefit from the proposed systems and/or devices. For instance, an isolator may be configured to use capacitive, optical, inductive, and/or magnetic isolation components without departing from the scope of the present disclosure.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An isolation device, comprising:
   a first emitter configured to produce a first signal according to a first control signal logic;
   a second emitter configured to produce a second signal according to a second control signal logic that is different from the first control signal logic;
   a detector configured to receive the first signal and the second signal, when produced by the first emitter or second emitter, respectively, wherein the detector is configured to generate an output representing a combination of the first signal and the second signal, wherein the detector is electrically isolated from the first emitter and second emitter such that electrical current flowing through the first emitter or second emitter is substantially prevented from passing to the detector, wherein the first emitter is coupled to a first supply voltage and a first ground, wherein the second emitter is coupled to a second supply voltage and a second ground, wherein the detector is coupled to a third supply voltage and a third ground, and wherein the first supply voltage, the second supply voltage, and the third supply voltage are electrically isolated from one another; and
   an encapsulant that encapsulates at least two of the first emitter, the second emitter, and the detector, wherein the first signal and the second signal are both capable of passing through the encapsulant.

2. The isolation device of claim 1, wherein the first emitter and the second emitter are both encapsulated by the encapsulant and wherein the encapsulant electrically isolates the first emitter from the second emitter.

3. The isolation device of claim 2, wherein the encapsulant at least partially contributed to an isolation boundary established between the first emitter and the detector as well as the second emitter and the detector and wherein the isolation boundary is also established with an isolation barrier that comprises a greater isolation property than the encapsulant.

4. The isolation device of claim 1, wherein the encapsulant comprises a first material configured to electrically isolate the detector from the first emitter and a second material configured to electrically isolate the detector from the second emitter.

5. The isolation device of claim 1, wherein the first emitter is substantially closer to the detector than the second emitter.

6. The isolation device of claim 5, wherein the first emitter is substantially aligned with a face of the detector whereas the second emitter is diagonally-oriented with respect to the face of the detector.

7. The isolation device of claim 6, wherein a vertical axis extends substantially orthogonally with respect to the face of the detector and wherein the vertical axis substantially intersects the first emitter but not the second emitter.

8. The isolation device of claim 5, wherein the second emitter is at least twice as far away from the detector as compared to the first emitter.

9. The isolation device of claim 1, wherein the output of the detector corresponds to a logical function of the first signal and the second signal.

10. The isolation device of claim 1, wherein the first emitter comprises a light-emitting device, wherein the second emitter comprises a second light-emitting device, and wherein the detector comprises a photodetector.

11. The isolation device of claim 1, wherein the first ground and the second ground are a common ground.

12. The isolation device of claim 1, wherein the first ground, the second ground, and the third ground are each electrically isolated from one another.

13. The isolation device of claim 1, wherein the output of the detector substantially represents the first signal when the second signal is not being transmitted and wherein the output of the detector substantially represents the second signal when the first signal is not being transmitted.

14. The isolation device of claim 1, wherein the detector is configured to apply a first threshold level and a second threshold level in connection with producing the output, wherein the first threshold level is configured to be compared to a first received signal correlated with the first signal, and wherein the second threshold level is configured to be compared to a second received signal correlated with the second signal.

15. The isolation device of claim 14, wherein the second threshold level is larger than the first threshold level such that the second received signal overrides the first received signal.

16. The isolation device of claim 14, wherein the second threshold level is larger than the first threshold level such that a logic function OR is performed with the first received signal and the second received signal.

17. The isolation device of claim 14, wherein the second threshold level is larger than the first threshold level such that a logic function AND is performed with the first received signal and the second received signal.

18. A system, comprising:
    a first power domain in which a first emitter is disposed such that the first emitter is capable of producing a first signal indicative of a first electrical signal in the first power domain;
    a third power domain in which a second emitter is disposed such that the second emitter is capable of producing a second signal indicative of a second electrical signal in the third power domain; and
    a second power domain in which a detector is disposed, wherein the second power domain is electrically isolated from both the first power domain and the third power domain, wherein the detector is configured to receive the first signal as well as the second signal and produce an output in response thereto that represents a combination of the first signal and the second signal, and wherein the output of the detector is used in connection with controlling a load that is also operating in the second power domain.

19. The system of claim 18, wherein:
    the first power domain is electrically isolated from the third power domain;
    a galvanic isolator includes the first emitter, the second emitter, and the detector;
    the galvanic isolator provides the electrical isolation between the first power domain, the second power domain, and the third power domain;

the output of the detector substantially represents the first signal during normal operation of the first power domain; and the output of the detector substantially represents the second signal during a power interruption in the first power domain.

20. A method of operating a control system across a plurality of power domains that are electrically isolated from one another, the method comprising:

producing a first control signal based on a first electrical signal in a first power domain;

producing a second control signal based on a second electrical signal in a third power domain;

receiving both the first control signal and the second control signal with a detector operating in a second power domain that is electrically isolated from both the first power domain and the third power domain;

based on a combination of the first control signal and the second control signal, producing an output with the detector; and providing the output of the detector to a load controller that is also operating in the second power domain, wherein the output of the detector is used by the load controller to control a load in accordance with the first control signal during normal operation of the first power domain, and wherein the output of the detector is used by the load controller to control the load in accordance with the second control signal during a power interruption event in the first power domain.

* * * * *